United States Patent [19]
Kaji

[11] Patent Number: 5,633,554
[45] Date of Patent: May 27, 1997

[54] PIEZOELECTRIC LINEAR ACTUATOR

[75] Inventor: Takatoshi Kaji, Ohbu, Japan

[73] Assignee: Sumitomo Heavy Industries, Ltd., Tokyo, Japan

[21] Appl. No.: 366,426

[22] Filed: Dec. 30, 1994

Related U.S. Application Data

[63] Continuation of Ser. No. 65,360, May 24, 1993, abandoned.

[30] Foreign Application Priority Data

May 29, 1992 [JP] Japan .................. 4-138184

[51] Int. Cl.⁶ .................................. H01L 41/08
[52] U.S. Cl. .................. 310/328; 310/330; 310/366; 310/367
[58] Field of Search ............... 310/328, 330, 310/331, 332, 366, 367, 358, 359, 800

[56] References Cited

U.S. PATENT DOCUMENTS

| | | | |
|---|---|---|---|
| 2,497,108 | 2/1950 | Williams | 310/367 |
| 3,445,843 | 5/1969 | Pena | 310/367 X |
| 3,781,955 | 1/1974 | Lavrinenko et al. | 310/367 X |
| 3,816,774 | 6/1974 | Ohnuki et al. | 310/332 |
| 3,900,748 | 8/1975 | Adler | 310/367 |
| 4,056,742 | 11/1977 | Tibbetts | 310/367 X |
| 4,195,243 | 3/1980 | Thaxter | 310/328 X |
| 4,874,979 | 10/1989 | Rapp | 310/328 |
| 5,089,740 | 2/1992 | Ono | 310/328 |
| 5,134,335 | 7/1992 | Ikemoto et al. | 310/328 |
| 5,173,605 | 12/1992 | Hayes et al. | 310/328 X |
| 5,233,258 | 8/1993 | Myoga et al. | 310/328 X |
| 5,293,094 | 3/1994 | Flynn et al. | 310/323 |
| 5,323,082 | 6/1994 | Wright | 310/328 |
| 5,325,010 | 6/1994 | Besocke et al. | 310/317 |
| 5,410,207 | 4/1995 | Miura et al. | 310/328 |
| 5,418,418 | 5/1995 | Hirano et al. | 310/328 |
| 5,451,827 | 9/1995 | Takagi | 310/323 |
| 5,489,812 | 2/1996 | Furuhata et al. | 310/323 X |

FOREIGN PATENT DOCUMENTS

| | | | |
|---|---|---|---|
| 0032781 | 4/1981 | Japan | 310/800 |
| 0066380 | 4/1983 | Japan | 310/359 |
| 0177979 | 10/1984 | Japan | 310/332 |
| 0183980 | 8/1986 | Japan | 310/328 |
| 0231667 | 9/1989 | Japan | 310/367 |
| 0231668 | 9/1989 | Japan | 310/367 |
| 0264582 | 10/1989 | Japan | 310/323 |
| 0228272 | 9/1990 | Japan | 310/323 |
| 4046574 | 2/1992 | Japan | 310/328 |
| 40-408888 | 3/1992 | Japan | 310/330 |
| 5137353 | 6/1993 | Japan | 310/328 |
| 197802 | 2/1978 | U.S.S.R. | 310/328 |
| 0710087 | 1/1980 | U.S.S.R. | 310/323 |

*Primary Examiner*—Mark O. Budd
*Attorney, Agent, or Firm*—Nikaido Marmelstein Murray & Oram LLP

[57] ABSTRACT

A piezoelectric ceramic linear actuator utilizing a piezoelectric characteristic which can be voluminously produced at a low cost. An electrode 104 is disposed on a ceramic green sheet 102 which is changeable in shape, constituting and electro-mechanical transducer element. A part of this piezoelectric ceramic green sheet 102 is fixed on a fixing base 106 (in the example given in FIG. 2, fixed on the left surface of a projection 108 of the fixing base 106), and the repetitive extension and contraction of a non-stationary part drives an article to be carried 110. In the example of FIG. 2, a wiring is installed so that there can be formed a first condition in which a C part contracts with the extension of an A part and at the same time a D part contracts with the extension of a B part, and a second condition in which the C part extends with the contraction of the A part and at the same time the D part extends with the contraction of the B part. In consequence, it is possible to move the article to be carried 110 rightward in the drawing, by repeating the first and second conditions alternately.

4 Claims, 4 Drawing Sheets

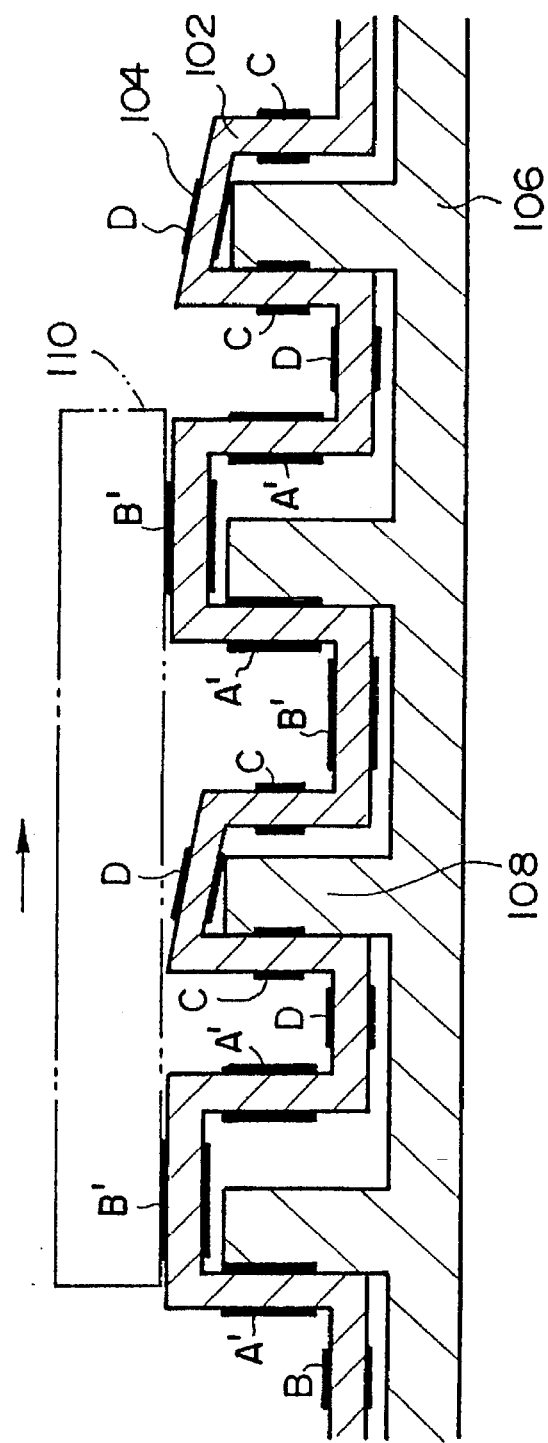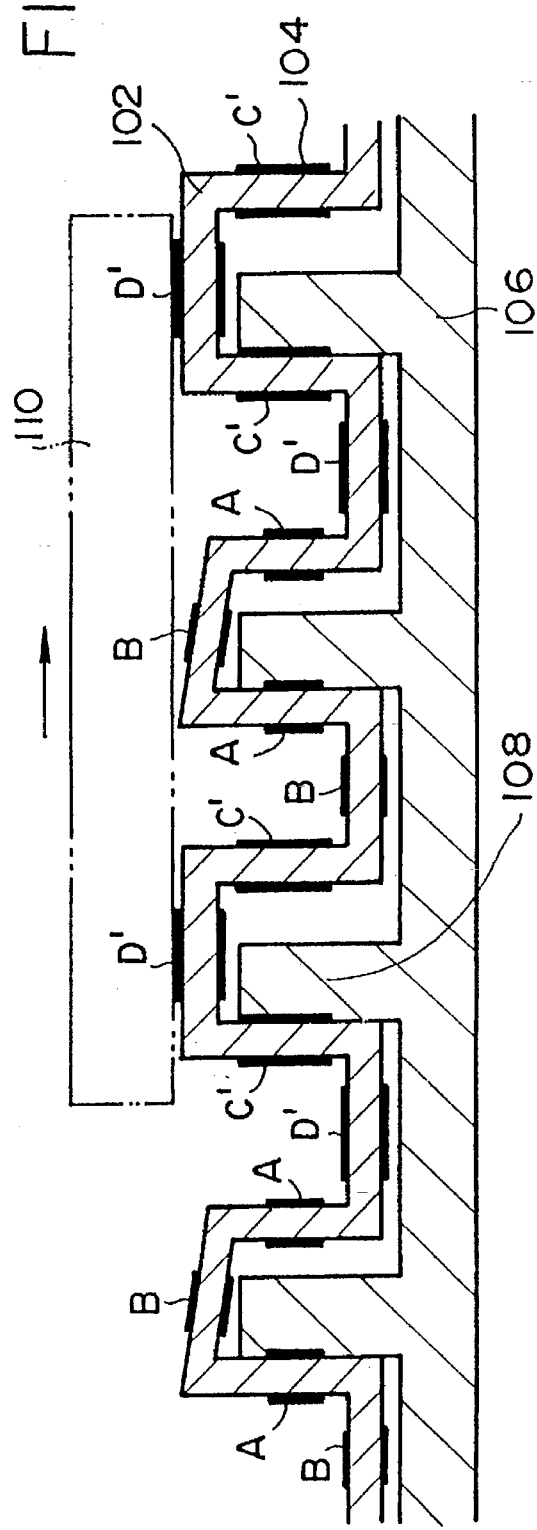

PIEZOELECTRIC LINEAR ACTUATOR

This application is a continuation of application Ser. No. 08/065,360 filed May 24, 1993 now abandoned.

BACKGROUND OF THE INVENTION

Field of the Invention

The present invention relates to a linear actuator utilizing a so-called piezoelectric characteristic.

As the linear actuator utilizing the piezoelectric characteristic, an actuator shown for example in FIG. 4 has been proposed.

This actuator has an excitation system including an excitation circuit 2, a piezoelectric member 4 and a resonance element 6, and a damping system including a damping circuit 8, a piezoelectric member 10 and a resonance element 12. Oscillation produced in the vertical direction X in the drawing from the piezoelectric member 4 by the excitation circuit 2 is amplified by means of the resonance element (horn) 6 to thereby excite one end of a rod 16 for moving an article to be carried 14. Oscillation thus produced is damped by means of the damping system located on the other side. Therefore there occurs a specific carrier wave on the rod 16 to move the article 14 from the damping system side toward the exciting system side.

However, since the linear actuator utilizing such a conventional piezoelectric characteristic uses plate-like piezoelectric members 4 and 10 as oscillation sources, a great voltage must be applied to the piezoelectric members 4 and 10 in order to obtain a great oscillation displacement usable for the actuator, and accordingly there is such a problem that a large-sized excitation system or a damping system will be required.

Also, since it was necessary to constitute the resonance system by combining the resonance members 6 and 12 produced of a metal and the piezoelectric members 4 and 10, there were problems such as limited shape, low mass producibility, and poor controllability.

Since the amount of distortion (amount of extension and contraction) is proportional to the strength of the electric field, the amount of distortion can be increased by decreasing the thickness of these members. Usually, however, these piezoelectric members 4 and 10, being difficult to decrease in thickness through processing, are unsuitable for mass production.

SUMMARY OF THE INVENTION

In view of the above-described various problems in the heretofore known techniques, it is an object of the present invention to provide a piezoelectric linear actuator which is capable of enhancing mass producibility and of gaining a great driving force at a low cost, on the basis of drastic reconsideration of the linear actuator utilizing a conventional piezoelectric characteristic.

The present invention has solved the above problems by depositing electrodes on a deformable piezoelectric ceramic green sheet to form an electro-mechanical transducer element, fixing a part of this piezoelectric ceramic green sheet on a fixing base, and by repeating extension and contraction of a non-stationary part to drive an article to be carried.

In the present invention, the constitution of the linear actuator utilizing a conventional piezoelectric characteristic has been drastically reconsidered, with the result that a thin-film ceramic green sheet (piezoelectric ceramic green sheet) having the piezoelectric characteristic, not a bulk (plate-like) piezoelectric material, is used as a source of oscillation.

The piezoelectric ceramic green sheet of prior art having the piezoelectric characteristic is heretofore known as "one layer" of a multi-layer piezoelectric actuator. This type of green sheet makes use of the characteristic "thinness" to realize the shape of multi-layer lamination, so that the green sheet will make extension and contraction in the "direction of thickness" in response to the application of electric voltage. Accordingly the article to be carried is not directly moved by said "extension and contraction itself."

The present invention, in the meantime, has been accomplished on the basis of the fact that (1) the green sheet can be changed in shape as desired and baked without changing the shape, and (2) the piezoelectric ceramic green sheet extends and contracts not only in the "direction of thickness" but in the "direction of plane" with the application of the electric voltage. That is, in the present invention, this piezoelectric ceramic green sheet is adopted as a source of driving force; and after baking into a specific shape, a part of the piezoelectric ceramic green sheet is fixed on a fixing base, and a non-stationary part is extended and contracted repetitively to drive the article to be carried. Since the green sheet is changeable in shape, a desired constitution is easily obtainable to realize linear actuators of various constitutions as described below.

Furthermore, using the green sheet can easily obtain a thin piezoelectric member, accordingly, a large displacement can be acquired with a little voltage. As a result, no large-voltage driving circuit become necessary, and also, no resonance system become necessary. Furthermore, because the green sheet can easily be mass-produced, it is possible to realize a low-cost piezoelectric linear actuator.

BRIEF DESCRIPTION OF THE DRAWINGS

The above and other objects, features and advantages of the present invention will become more apparent from the following description of the invention taken in conjunction with the accompanying drawings, wherein like reference characters designate the same or similar parts, and wherein:

FIG. 2(A)–2(B) are schematic sectional views for explaining the function of the first embodiment stated above;

DETAILED DESCRIPTION OF THE PREFERRED EMBODIMENT

Hereinafter preferred embodiments of a linear actuator according to the present invention will be explained in detail by referring to the accompanying drawings.

Figure 1:
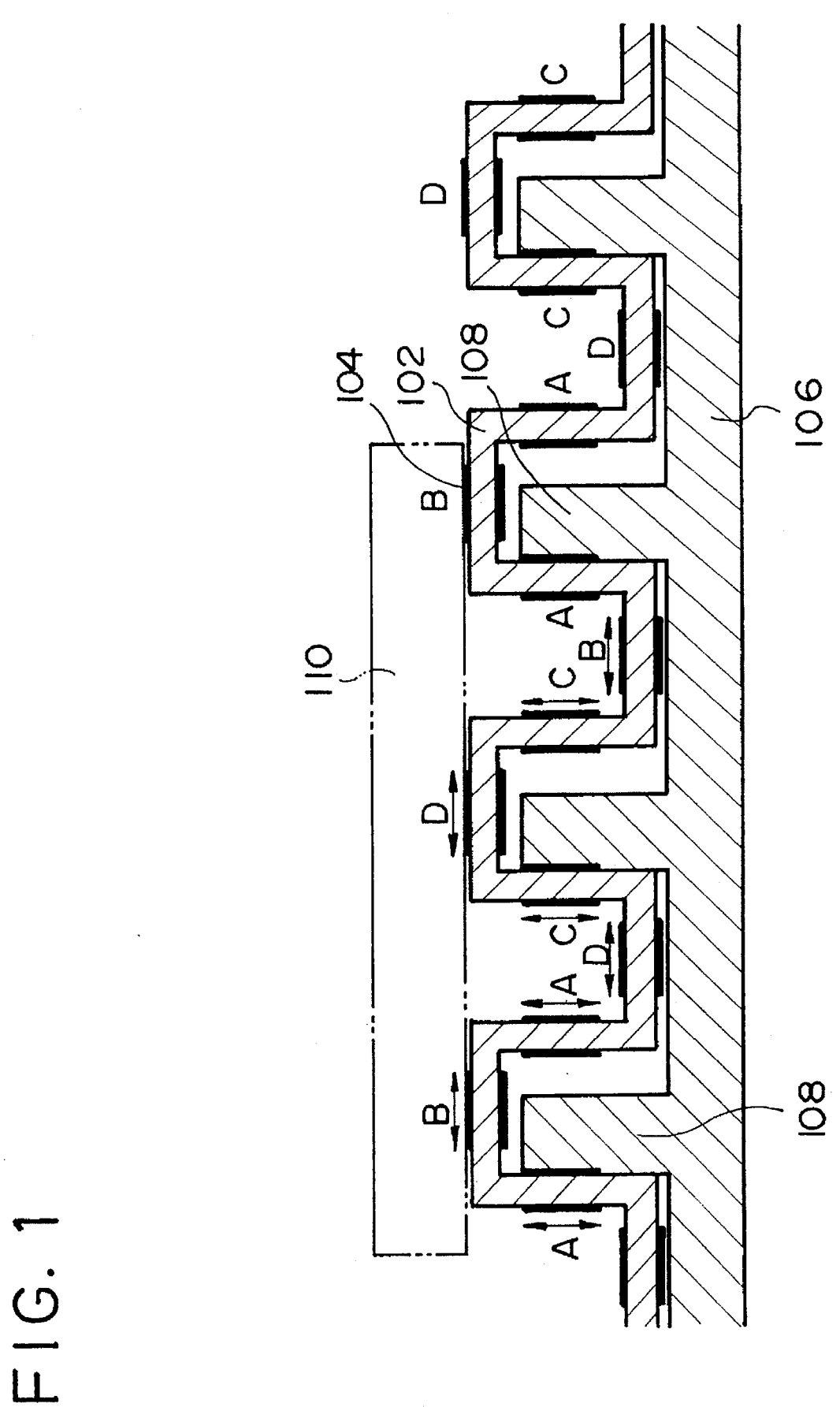
FIG. 1 is a schematic sectional view showing a first embodiment of a piezoelectric linear actuator according to the present invention.

FIG. 1 shows a first embodiment of the present invention. In this drawing, 102 refers to a piezoelectric ceramic green sheet; 104 denotes an electrode arranged on the piezoelectric ceramic green sheet; and 106 represents a fixing base.

The fixing base 106 has projections 108 at equal spaces.

The piezoelectric ceramic green sheet 102 is a sheet bent in a square zigzag form corresponding to the spacing of the projections 108 as illustrated, and is baked in this state. Thereafter the green sheet 102 is fixed on the left surface (in the drawing) of the projections 108 on the fixing base 106. The article to be carried 110 is located at the top part of the green sheet 102. In this embodiment, the article 110 is moved rightward in the drawing as described below.

That is, to explain this function by referring to reference numerals given in the drawings, a wiring of an electrode 104 concerning the present embodiment is connected such that a C part contracts when a A part extends, and at the same time a B part extends when and a D part contracts (a first state). Incidentally, "a A part (B, C, D part)" respresents a part in which an electrode A (B, C, D) of the piezoelectric ceramic green sheet 102 exists.

With this electrode wiring, if the positive and negative of voltage to be superimposed are reversed all at once, then the C part extends when the A part contracts, and at the same time the B part contracts while the D part extends (a second state).

When each electrode is in the first condition, as indicated in FIG. 2(A) the C part contracts when the A part extends, and accordingly the D part moves away from the article to be carried 110. The article 110, therefore, is moved rightward with the extension of the B part. In this state, when the positive and negative of the voltage applied to each electrode are reversed, the electrode changes to the second state, in which the A part contracts and the C part extends as indicated at in FIG. 2(B). As a result, the piezoelectric ceramic green sheet 102 at the B part moves away from the article to be carried 110, and the article 110 is moved further rightward with the extension of the D part.

In consequence, it has become possible to continuously move the article 110, only in the rightward direction by periodically reversing the positive and negative of the voltage to form the first and second states alternately. In FIG. 2, the portion which extends is designated by a sign "", while no mark is used for the portion which contracts.

In the first embodiment, the article to be carried 110 is moved rightward; however, since the connection of the positive and negative of voltage to each electrode can easily be changed, it is possible to easily change the positive and negative of the voltage to enable the leftward movement of the article 110, without changing this basic construction, by repeating the third state in which the B part contracts when the A part extends and at the same time the C part contracts and the D part extends and the fourth state in which the above-described relation of extension and contraction is reversed.

In the first embodiment described above, the example is shown that one piezoelectric ceramic green sheet changed to a square shape is used; it is, however, possible to construct the linear actuator capable of actuating a greater load, by laminating the piezoelectric ceramic green sheets.

Figure 3:
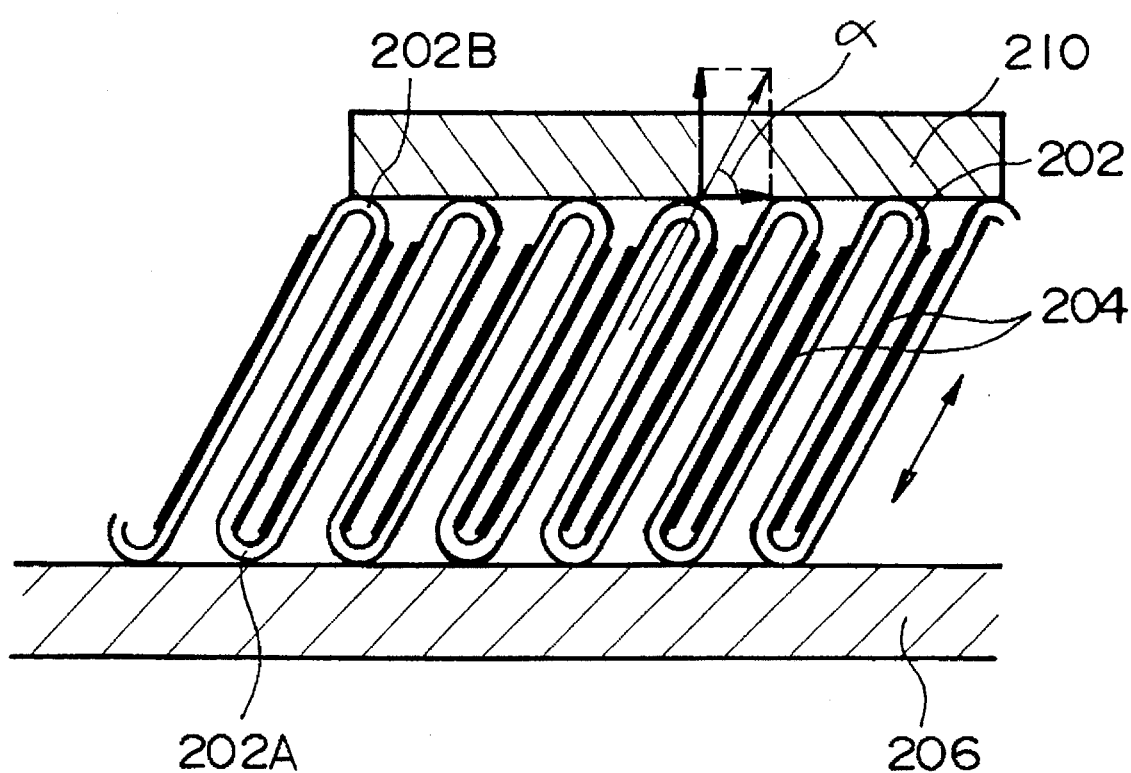
FIG. 3 is a schematic sectional view showing a second embodiment of the present invention.
Figure 4:
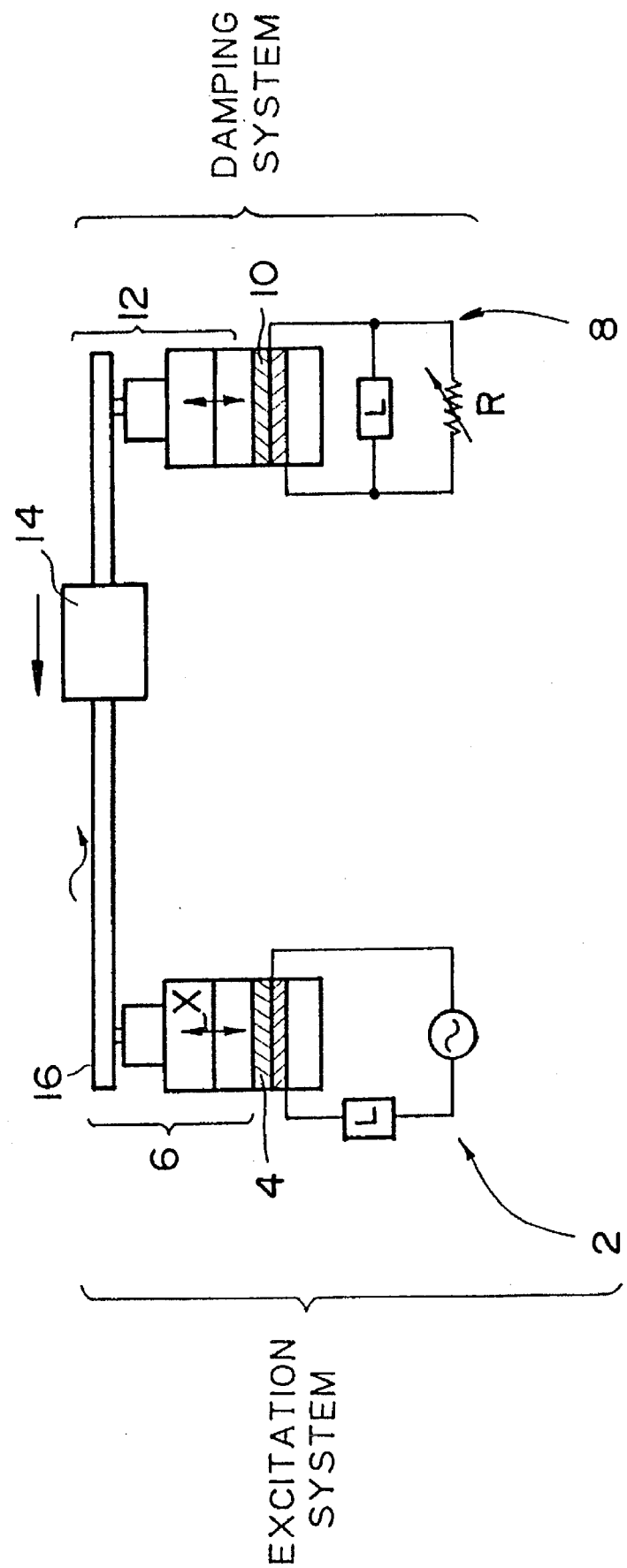
FIG. 4 is a sectional view showing the constitution of a conventional linear actuator utilizing a piezoelectric characteristic.

This example (the second embodiment of the present invention) is shown in FIG. 3. In this second embodiment, one piezoelectric ceramic green sheet 202 is laminated much more densely at a specific angle α in relation to the fixing base 206. The electrode 204 is disposed at the straight-line portion of the piezoelectric ceramic green sheet 202. The lower bent part 202A of the piezoelectric ceramic green sheet 202 is fixed on the fixing base 206, and the article to be carried 210 is supported at the upper bent part (projecting part) 202B.

When the all projections are extended and contracted at once at a relatively high speed in this state, it is possible to impart the article to be carried 210 with a horizontal component of force at the time of extension of the projecting part 202B, enabling the rightward movement (in the drawing) of the article 210. Also, when the projecting part 202B is contracting, since the projecting part 202B instantly moves away from the article 210, the horizontal component of force of the projecting part 202B at the time of contraction will not work as a force for moving the article 210 back leftward, and consequently the article 210 is kept on moving rightward.

According to the second embodiment, one piezoelectric ceramic green sheet 202 is laminated substantially in multiple layers and the article to be carried 210 is disposed thereon; therefore it will become possible to transfer a heavier article than that stated in the first embodiment.

It should be noted that, in either of the first and second embodiments, it is possible to add a contrivance or constitution to the above constitution, to thereby enable smoother transfer of the article.

For example, in either of the first and second embodiments, it can not be prevented the occurrence of slight vertical vibration in the course of transfer; however it will become possible to transfer even a relatively heavy article absorbing the vertical vibration, by mounting for example a guide rail. That is, the article is basically supported by means of this guide rail to be moved along this guide rail with a horizontal driving force.

Furthermore, in these two embodiments, the driving force is obtained mainly by taking out the extension and contraction in the direction of the plane of the green sheet; however, it is to be noticed that the present invention is not limited to the utilization of the extension and contraction of the green sheet in this direction, but the extension and contraction in the direction of thickness may be taken out depending upon the formation or shape of the green sheet. Furthermore, both may be combined to obtain the driving force.

According to the present invention, as heretofore explained, the ceramic green sheet having a piezoelectric characteristic is used (not a conventional bulk (plate-like) piezoelectric material) as a source of oscillation of the linear actuator using the piezoelectric characteristic. Therefore, it is possible to easily obtain a thin piezoelectric material, with the result that a large displacement can be acquired by the use of a little voltage. Furthermore, since the driving construction itself is totally different, a large-voltage driving system is not required and the resonance system can be dispensed with.

Furthermore, the green sheet, having design flexibility in shape, can easily be changed in construction in accordance with an article to be carried, and enables realizing mass production with ease and at a low cost.

What is claimed is:

1. A piezoelectric linear actuator which carries an article along a straight line, comprising:

a piezoelectric ceramic green sheet which is changeable in shape, said piezoelectric ceramic green sheet having an undulating surface when not driven and when driven, undulations of the undulating surface change shape;

a fixing base; and electrodes disposed on said piezoelectric ceramic green sheet to constitute an electromechanical transducer element;

wherein a stationary part of said piezoelectric ceramic green sheet is permanently fixed on said fixing base; and a non-stationary part of said piezoelectric ceramic green sheet is repetitively extended in a plane of said piezoelectric ceramic green sheet and contracted in said plane in order to directly linearly drive said article linearly across said undulating surface of the piezoelectric ceramic green sheet from a first point on the undulating surface to a second point on the undulating surface in the straight line by contact between said piezoelectric ceramic green sheet and said article.

2. A piezoelectric linear actuator according to claim 1, wherein said fixing base has plural projections arranged at equal spaces; said piezoelectric ceramic green sheet is bend in a square zigzag form correspondingly to the spaces of said projections; and said piezoelectric ceramic green sheet and said fixing base are fixedly attached on one surface of said projections.

3. A piezoelectric linear actuator according to claim 1, wherein said piezoelectric ceramic green sheet is closely laminated and is fixedly attached of said undulating surface on one side of said lamination on said fixing base so that the surfaces of layers of said lamination will have a specific angle in relation to said fixing base.

4. A piezoelectric linear actuator which carries an article along a straight line, comprising:

a piezoelectric ceramic green sheet which has design flexibility in shape;

a fixing base; and electrodes disposed on said piezoelectric ceramic green sheet, which is changeable in shape, to constitute an electromechanical transducer element;

wherein a stationary part of said piezoelectric ceramic green sheet is permanently fixed on said fixing base; and a non-stationary part of said piezoelectric ceramic green sheet is repetitively extended in a plane of said piezoelectric ceramic green sheet and contracted in said plane in order to directly drive said article across a surface of the piezoelectric ceramic green sheet from a first point on the surface to a second point on the surface in the straight line by contact between said piezoelectric ceramic green sheet and said article, wherein said fixing base has plural projections arranged at equal spaces; said piezoelectric ceramic green sheet is bent in a square zigzag form correspondingly to the spaces of said projections; and said piezoelectric ceramic green sheet and said fixing base are fixedly attached on one surface of said projections.

\* \* \* \* \*